United States Patent [19]

Moser, Jr.

[11] Patent Number: 4,477,741
[45] Date of Patent: Oct. 16, 1984

[54] DYNAMIC OUTPUT IMPEDANCE FOR 3-STATE DRIVERS

[75] Inventor: John J. Moser, Jr., Essex Junction, Vt.

[73] Assignee: International Business Machines Corporation, Armonk, N.Y.

[21] Appl. No.: 362,828

[22] Filed: Mar. 29, 1982

[51] Int. Cl.³ ............... H03K 19/094; H03K 19/003; H03K 19/007
[52] U.S. Cl. .................................. 307/473; 307/442; 307/584; 307/270; 307/443
[58] Field of Search ........... 307/270, 442, 443, 200 B, 307/473, 474, 577, 584, 594, 597, 605; 330/264, 269; 361/58

[56] References Cited

U.S. PATENT DOCUMENTS

| | | | |
|---|---|---|---|
| 3,649,851 | 3/1972 | Cohen | 307/270 |
| 3,946,245 | 3/1976 | McClaughry | 307/482 |
| 4,032,795 | 6/1977 | Hale | 307/270 X |
| 4,217,502 | 8/1980 | Suzuki et al. | 307/270 X |
| 4,291,242 | 9/1981 | Schriber | 307/270 |
| 4,329,600 | 5/1982 | Stewart | 307/270 X |
| 4,363,978 | 12/1982 | Heimbigner | 307/473 X |
| 4,404,474 | 9/1983 | Dingwall | 307/443 X |
| 4,421,994 | 12/1983 | Puri et al. | 307/270 X |

OTHER PUBLICATIONS

Lee et al., "Low-Power Dissipation Fet Driver Circuit"; IBM Tech. Discl. Bull.; vol. 14, No. 4, pp. 1084–1085; 9/1971.

Primary Examiner—Larry N. Anagnos
Attorney, Agent, or Firm—Francis J. Thornton

[57] ABSTRACT

This describes a tristate driver circuit designed such that it will not be destroyed by excessive high voltage conditions when two such drivers are connected to a bus at the same time. The circuit accomplishes this with parallel high current, low impedance and low current, high impedance output devices, coupled to means for causing the high current, low impedance devices to supply, to the circuit output, only the initial high currents required without inhibiting the low current, high impedance devices from maintaining the steady state conditions needed to clamp the output at the desired output level. The circuit is arranged to cause both high and low current output devices to be initially conductive to charge the output terminal to the desired level, but to subsequently shut off the high current, low impedance device while keeping the low current, high impedance device in a condition to clamp the output at the desired level. This result is achieved by providing the high current output devices with means for automatically terminating once the initially required high current has been supplied to the output.

3 Claims, 2 Drawing Figures

DYNAMIC OUTPUT IMPEDANCE FOR 3-STATE DRIVERS

BACKGROUND OF THE INVENTION

The present invention relates generally to driver circuits and more particularly to so-called trilevel driver circuits having the capability of supplying three different level of signals to capacitive loads.

Logic circuit designers know that the use of tristate drivers has advantages in the design of computing and data processing systems which use so-called bus architectures.

Present tristate bus architecture requires low impedance, high current drivers due to high stray bus capacitance, high data rate transfer requirements and high DC static receiver current. Although it has been well known that the use of such tristate drivers has advantages for the designer of bus architectures, computer and data processing systems they have not been widely used.

Generally, limitations and the number of chip I/O pins had led product designers to use bidirectional busses in order to utilize the available input/output pins most effectively. This use of bidirectional busses is based on the premise that at any given time only one chip will be sending information to other chips within the system. However such tristate drivers are connected in multiples to a single bus in the architecture and under some conditions two or more drivers can be inadvertently and simultaneously switched to opposing logical levels. For example, a first chip could be attempting to force the bus to a 1 condition while a second chip coupled to the same line is attempting to force the same line to a 0 condition. This causes not only the information on the bus to be destroyed but it also causes the driver circuits coupled to the bus to be burned out. The use of such drivers in bus architecture has thus been inhibited due to the fact that system failures or programming errors can cause the drivers to be destroyed.

This situation, where two chips attempt to simultaneously send different or opposing logic data on the same bidirectional bus, is called an orthogonality condition. Ideally of course such an orthogonality condition should never occur within the system and can be avoided by a strict communication protocol within the system. However a program defect in the protocol software can physically damage the entire system. Moreover in such systems faults which cannot be tested without creating orthogonal states become untestable. Therefore under some conditions it may be necessary to bypass this protocol in order to fully test the system. Such damage can be particularly serious to the system architecture since a failure within the communication protocol circuitry cannot only damage the tristate driver in the chip, but can damage another one in another chip and correction of one of the damaged devices will not resolve the problem until the original fault is fully diagnosed and eliminated.

It is thus an object of the present invention to provide an improved driver circuit that will not be damaged when coupled through a bus to another driver circuit switched to an opposing logic level. The driver circuit of the invention also has high switching speed, reduced power dissipation and which is designed to provide initial current of sufficient magnitude to charge the bus capacitance during the signal transition and subsequently reduce the current available to the bus to a value sufficient only to drive the DC load on the bus and insufficient to damage the output device even if another driver on the same line is turned on to the opposing logical level. Thus, in effect, the driver has a built-in current limiting device which prevents damage.

It is therefore an object of the invention to provide driver circuits, the use in such bus architecture in which damage due to orthogonality conditions is minimized or eliminated. It is further an object of the invention to prevent communication protocol software failure from physically damaging the system in which the tristate driver circuit is utilized. It is a further object of the invention to provide a tristate circuit in which faults in the system requiring orthogonal states can be easily and readily tested.

SUMMARY OF THE PRESENT INVENTION

The present invention achieves all of these objects and other desirable results by providing a tristate logic circuit wherein the circuit is provided with a dynamic output impedance means which will supply large initial transient currents of sufficient magnitude to charge the bus capacitance during the initial signal transition, but will then reduce the current in the driver circuit to a value sufficient only to drive the DC load on the bus without supplying excess current which can damage the output device when a similar driver coupled to the same bus line is simultaneously turned on to the opposing logic level.

DESCRIPTION OF THE PREFERRED EMBODIMENTS

Figure 1:
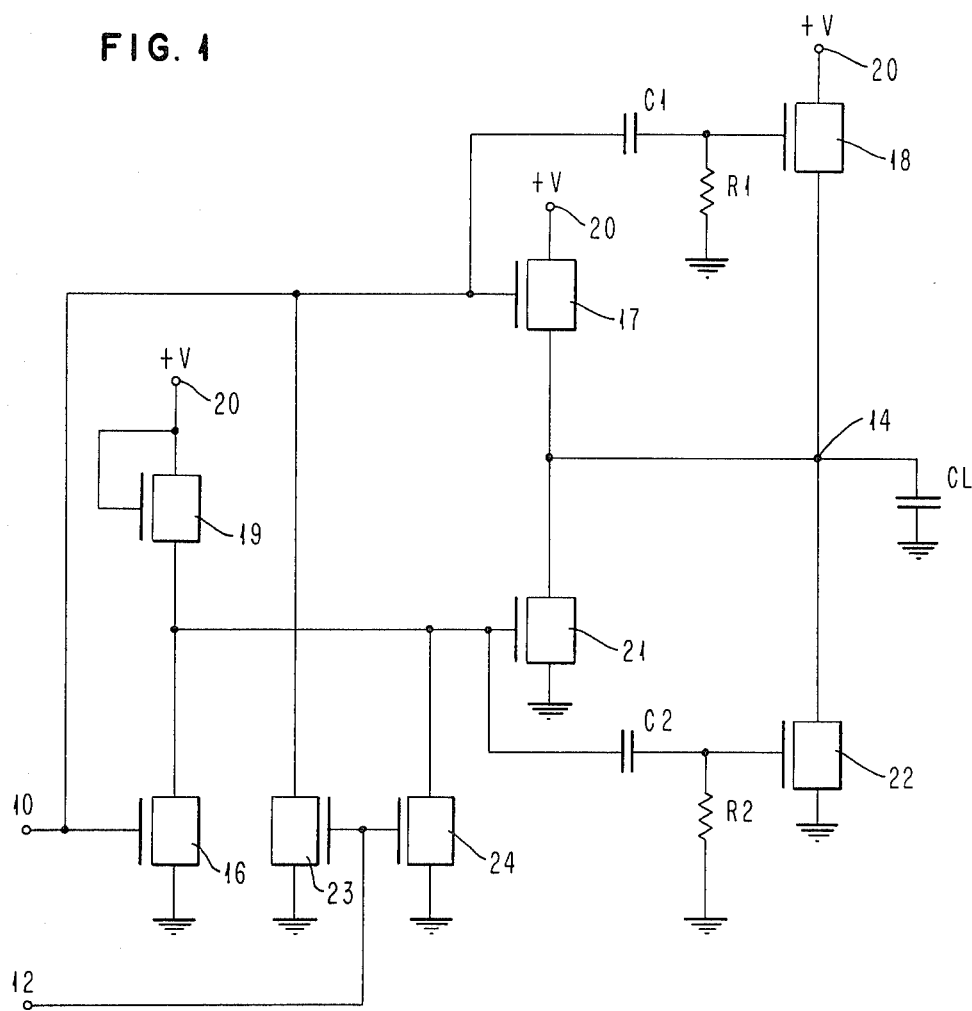
FIG. 1 is a schematic diagram of one embodiment of the present invention comprising a tristate driver circuit provided with a dynamic output impedance in accordance with the present invention.

Referring now to FIG. 1, there is shown a trilevel driver circuit built in accordance with the present invention and utilizing Field Effect Transistor (FET) devices.

The driver circuit of the invention comprises a first input 10 to which positive or negative data signals can be applied and a second input 12 to which a disable signal may be applied. An output 14, at which the output signal of the trilevel circuit is derived, and which may be connected to a bus is also provided.

The first input terminal 10 is directly connected to the gate of an inverter FET transistor 16 and to the gate of a low current, high impedance, positive output, transistor 17 and capacitively coupled via capacitor C1 to the gate of a high current, low impedance, positive output, transistor 18. The source of transistor 16 is coupled to ground and its drain is coupled, through an FET transistor load device 19, to a positive voltage supply 20. The drain of transistor 16 is also directly coupled to the gate of a low current, negative output, high impedance transistor 21 and capacitively coupled via capacitor C2 to the gate of a high current, negative output, low impedance transistor 22.

The drains of transistors 17 and 18 are also coupled to the positive voltage source 20 while their sources are coupled to the output 14. Conversely the drains of transistors 21 and 22 are coupled to the output 14 and their sources are coupled to ground. Furthermore, the gates of the high current transistors 18 and 22 are resistively coupled to ground through respective grounding resistors R1 and R2. The disable input 12 is connected to the gates of disabling transistors 23 and 24 whose sources are connected to ground and whose drains are respectively coupled to the gates to the output transistors 17 and 18, and 21 and 22.

For purposes of describing the operation of the circuit, the input data signal applied to the input circuit 10 will be assumed to be a pulse rising from 0 volts to +5 volts. It should however be understood that other voltages and ranges could be used as is well known to those skilled in the art of circuit designs. When the input signal rises to +5 volts transistors 16, 17 and 18 all turn on. Transistors 16 and 17 have the input signal applied directly to the gates while only the AC component of the signal is applied to the gate of transistor 18 because of the DC blocking capacitor C1. When transistor 16 turns on it pulls the voltage on the gate of transistors 21 and 22 towards ground at zero volts turning off transistors 21 and 22. When transistors 17 and 18 turn on they begin supplying current to the output 14 and driving the output 14 positive. The transistor 18 is a high power device in order to provide a high output current surge necessary to drive the output 14 to the correct new voltage level. The dominant load of the bus provided at output 14 is represented by capacitor CL and shows a high initial surge of current in order to change its voltage level. Once this high initial surge of current is satisfied and the output 14 is charged to the desired voltage very little steady state current is required to hold the voltage level thus, the high current device 18 can be shut off. The capacitive resistive network composed of capacitor C1 and R1 does this by reducing the gate voltage of transistor 18 at a known rate depending on the size of R1 and C1. Although transistor 18 turns off, transistor 17, which has the steady state data signal applied to its gate, remains on and supplies the necessary low level, steady state, current needed to maintain the desired voltage level at the output 14. Thus transistor 18 provides a low impedance high current path for the initial surge of current which path is automatically terminated once the initial surge of current is abated.

Similarly, when the voltage applied to the gate of transistor 16 is reduced to 0 volts transistor 16 turns off permitting the device 19 to apply a positive voltage pulse to the gate voltage of transistors 21 and 22 and cause transistors 21 and 22 to turn on. When transistor 22 turns on a large current surge is dissipated through transistor 22 to ground rapidly pulling the output 14 down to the desired value. Again because of a capacitive coupling network, comprised of a capacitor C2 and a resistor R2, the gate voltage of transistor 22 is brought to ground to turn off transistor 22 while the steady state voltage applied to the gate of transistor 21 via transistor 19 causes transistor 21 to remain on and continue to hold down the output 14. As discussed previously the transistor 22 has a low impedance path for the necessary high current transitions which occur during switching of the output 14 to a low level. When a positive signal is applied to the disable input 12 the transistors 23 and 24 turn on grounding the gates of the output transistors 17 and 21 causing these devices to turn off and isolate the output 14. This prevents the output from being clamped to a voltage by any of the output devices 17, 18, 21, or 22 such that the output 14 floats up or down dependent on the load CL. Thus, the output 14 is considered to be in its trilevel or indeterminate state.

Thus, the tristate driver described in the figure is one in which its output impedance changes in a dynamic fashion during voltage transitions of the output. The dynamic output transistors 18 and 22 provide low impedance paths for the high current surges necessary to rapidly charge or discharge the output line to the desired voltage levels while the low current, high impedance steady state devices 17 and 21 maintain a steady state current necessary to hold the level of the output 14 at a desired level. The circuit formed as described in conjunction with the foregoing supports all present applications for tristate drivers, without having the disadvantage of burning out during the so-called orthogonality conditions as described previously. No logic failure within the system will cause a tristate driver built in accordance to the present invention to burn out or be otherwise damaged. Additionally the test coverage of such systems can be increased because faults can now be tested without regard to the outputs created by the testing patterns.

Figure 2:
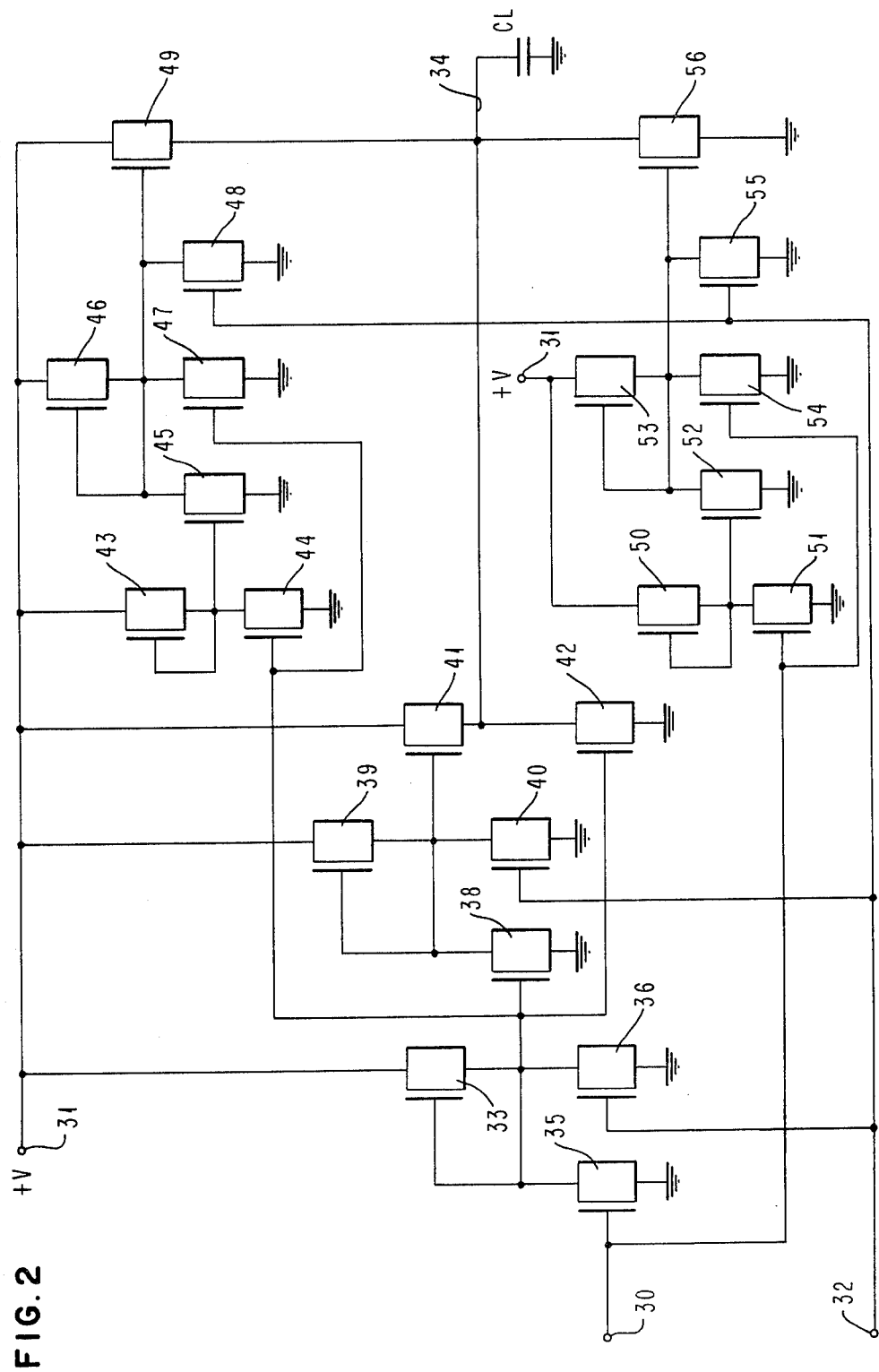
FIG. 2 is a schematic diagram of a second circuit embodying the invention.

FIG. 2 describes an alternate circuit which assures that the selected high current path, low impedance output transistor turns on before the selected steady state current output transistor turns on. Again in the figure FET transistors are used. The circuit is provided with a data input 30, a disable input 32 and output 34 to which is coupled a capacitance load again represented as capacitor CL.

In this circuit the data input line 30 is directly coupled to the gates of transistors 35, 51 and 54 whose sources are coupled to ground. Each of these devices has its drain coupled to a positive voltage source 31 through a respective FET load device 33, 50, and 53. The drain of transistor 35 is also coupled to the gates of transistors 38, 42, 44 and 47.

Each of these transistors 38, 42, 44, and 47 has its source connected to ground. Transistors 38, 44, and 47 have their drains coupled through respective FET load devices 39, 43, and 46 to voltage source 31. The drain of transistor 38 is also coupled to the gate of a steady state, high impedance output transistor 41 and the drain of a disable transistor 40. Transistor 42 is also a high impedance output transistor but has its drain connected to the output line 34. The drain of transistor 44 is also coupled to the gate of a transistor 45 whose drain is connected to the drain, of transistors 47, and 48 and gate of a low impedance, high current output transistor 49.

The drain of transistor 51 is connected to the gate of transistor 52 whose source is grounded and whose drain is connected to the drain of transistors 54 and 55 and the gate of a low impedance, high current, output transistor 56 which has its drain connected to the output line 34.

The disable line 32 is connected to the gates of disable transistors 36, 40, 48 and 55.

The circuit operates as follows. A positive signal is applied to the gate of transistors 35, 51 and 54 turning these devices on. This causes the gates of transistors 38, 42, 44, 47, 52 and 56 to be pulled to ground and these devices turn off. When transistors 42 and 56 turn off output line 34 is no longer grounded and is now in condition to rise to a positive voltage.

When device 47 turns off, the gate of transistor 49 rises to a positive level through load device 46. This causes the high current, low impedance, output transistor 49 to turn on and the output line 34 goes to a positive voltage.

Transistor 45 remains off for the period of time it takes for device 44 to fully turn off. When device 44 fully turns off, transistor 45 turns on grounding the gate of transistor 49 and turning transistor 49 off.

Thus, transistor 49 turns on before transistor 41. Because transistors 38 and 44 are turned off together their source follower transistors 41 and 45 turn on together and transistor 41 begins supplying a steady state current to hold output line 34 just as transistor 49 begins turning off due to the grounding of its gate by the turning on of transistor 45.

This circuit thus assures that the high current, low impedance, output transistor 49 turns on before the steady state, high current output transistor 41 turns on. Thus burn out of the low impedance output transistor 49 due to excessive current flow is avoided.

When a negative voltage signal is applied to the gate of transistors 35, 51 and 54 they shut off and the gates of transistors 38, 42, 44, 47, 52 and 56 all become positive and these transistors 38, 42, 44, 47, 52, 56 all begin to turn on. Because transistor 56, being the high current, low impedance device, must remain on for a period of time sufficient to initially discharge the output line 34, device 52 should be designed to turn on more slowly than device 56. If a suitable device cannot be designed additional devices, to assure that the turning on of transistor 52 is delayed, can be provided between transistors 51 and 52.

Once transistor 52 turns on transistor 56 turns off.

When a positive disable signal is present on input 32, transistors 36, 40, 48, and 55 are all turned on turning off the output devices 41, 42, 49, and 56 and preventing the output line 34 from being clamped such that the line 34 floats up or down dependent on the load CL connected to the output line 34 and is in its indeterminate or trilevel state.

It should be understood that the principles of the invention can be also used with bipolar transistors.

While the invention has been particularly described with reference to the preferred embodiments thereof it will be understood by those skilled in the art that the foregoing and other changes in form and details be made therein without departing from the spirit and scope of the invention.

What is claimed is:

1. A driver circuit comprising:
    an input signal means,
    first, second, third, fourth, fifth, sixth and seventh field effect transistors, each having a drain electrode, a source electrode and a control electrode,
    the first transistor having its drain electrode coupled to a voltage source through a load device, its source electrode coupled to ground, and its control electrode coupled to said input signal means,
    the second transistor having its control electrode coupled to said input signal means, its drain electrode coupled to said voltage source and its source electrode connected to a capacitive load,
    the third transistor in parallel with said second transistor, the drain electrode of said third transistor coupled to said voltage source and its source connected to said load, and its control electrode coupled to the control electrode of the second transistor through a capacitor and to ground through a resistor to change the voltage on the control electrode of said third transistor a preselected time after a signal is applied thereto,
    the fourth transistor having its control electrode connected to the drain electrode of the first transistor, its drain electrode coupled to the load, and its source connected to ground,
    the fifth transistor having its drain electrode connected to the load, its source electrode connected to ground, and its control electrode coupled to the control electrode of the fourth transistor through a capacitor and to ground through a resistor to change the voltage on the control electrode of said fifth transistor a preselected time after a signal is applied thereto,
    the control electrodes of said sixth and seventh transistors being coupled to a disable input, the drain of the sixth transistor being coupled to the control electrode of said second transistor, and the drain of said seventh transistor being coupled to the control electrode of said fourth transistor and their sources being coupled to ground whereby turning on of said sixth and seventh transistors grounds the control electrodes of said second and fourth transistors thereby isolating said capacitive load.

2. The device of claim 1 wherein said load device comprises:
    a field effect transistor having its gate coupled to its drain.

3. A trilevel driver circuit comprising:
    an input signal means,
    a signal inverter means connected to said input means for providing at its output an inverted input signal,
    first and second push-pull transistor pairs, one of said pairs comprising two serially arranged high impedance transistors and the other of said pairs comprising two serially arranged low impedance transistors,
    a capacitively loaded output means coupled to both of said push-pull pairs of transistors,
    one of said high impedance transistors having its control element connected to the signal input means and the other of said high impedance transistors having its control element connected to the output of said inverter,
    a first capacitor means coupling the control element of the first one of said low impedance transistors to the control element of the first one of said high impedance transistors, a first resistor connecting the control element of said first one of said low impedance transistors to ground, a second capacitor means coupling the control element of the second one of said low impedance transistors to the control element of the second one of said high impedance transistors and a second resistor connecting the control element of said second one of said low impedance transistors to ground for altering the signals applied to said low impedance transistors without altering the signals applied to said high impedance transistors, and
    disabling means coupled to the control elements of said high impedance transistors for grounding said control elements and causing said high impedance transistors to turn off to prevent said output from being clamped to a voltage and permiting said output means to float dependent on the capacitive load on said output means.

* * * * *